United States Patent
Komiya et al.

(10) Patent No.: US 6,573,191 B1
(45) Date of Patent: Jun. 3, 2003

(54) INSULATING FILM FORMING METHOD AND INSULATING FILM FORMING APPARATUS

(75) Inventors: Takayuki Komiya, Nirasaki (JP); Shinji Nagashima, Kumamoto-Ken (JP); Shigeyoshi Kojima, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/665,664

(22) Filed: Sep. 20, 2000

(30) Foreign Application Priority Data

Sep. 22, 1999 (JP) .......................................... 11-269397

(51) Int. Cl.[7] .............................................. H01L 21/31
(52) U.S. Cl. ........................ 438/763; 438/780; 438/781
(58) Field of Search ................................. 438/725, 761, 438/763, 765, 766, 780, 781, 782, 758, 789; 427/255.6, 515, 578

(56) References Cited

U.S. PATENT DOCUMENTS

| | | | | |
|---|---|---|---|---|
| 6,068,884 A | * | 5/2000 | Rose et al. | 427/255.6 |
| 6,071,830 A | * | 6/2000 | Matsuzawa et al. | 438/778 |
| 6,136,624 A | * | 10/2000 | Kemmochi et al. | 438/149 |
| 6,171,979 B1 | * | 1/2001 | Aoi | 438/778 |
| 6,200,912 B1 | * | 3/2001 | Aoi | 438/622 |

FOREIGN PATENT DOCUMENTS

| | | | |
|---|---|---|---|
| JP | 6-029282 | 2/1994 | |
| JP | 9-008025 | 1/1997 | |
| JP | 10135201 A | * 5/1998 | ......... H01L/21/316 |
| JP | 10-036769 | 2/1999 | |
| JP | 11-145284 | 5/1999 | |
| JP | 11-251310 | 9/1999 | |

* cited by examiner

Primary Examiner—Olik Chaudhuri
Assistant Examiner—Brook Kebede

(57) ABSTRACT

Both of a first insulating film and a second insulating film are formed by a spin coating method. Accordingly, the formation of the first insulating film and the second insulating film can be performed in the same SOD processing system. Moreover, the aforesaid formation of both of the first insulating film and the second insulating film by the spin coating method can provide favorable low dielectric constant properties and good adhesion of the first insulating film and the second insulating film.

6 Claims, 16 Drawing Sheets

INSULATING FILM FORMING METHOD AND INSULATING FILM FORMING APPARATUS

BACKGROUND OF THE INVENTION

1. Field of the Invention

The present invention relates to an insulating film forming method and an insulating film forming apparatus each for forming an insulating film composed of two or more layers on a substrate such as a semiconductor wafer or the like.

2. Description of the Related Art

A technique for flattening a layer insulating film formed on a semiconductor wafer (hereinafter referred to only as "a wafer") is especially important in multilayer interconnection techniques. As one example of the technique, a technique for making the layer insulating film multilayered is given.

For example, in Japanese Patent Laid-open No. Hei 10-135201, a method for forming such a layer insulating film is disclosed. According to this method, an inorganic SOG solution is applied on a foundation layer insulating film by spin coating, and pre-drying is performed by heating to a temperature between about 100° C. and about 250° C. to form an inorganic SOG film (a first insulating film). On the inorganic SOG film, a silicon oxide film (a second insulating film) is formed by a plasma CVD method with TEOS as a base.

There is, however, a problem that low dielectric constant properties of the first insulating film and the second insulating film are deteriorated by chemical reaction if the second insulating film is formed by the CVD method as described above.

Further, according to experiments by the present inventor, et al., it is proved that the adhesion of the first insulating film and the second insulating film is poor if the second insulating film is formed by the CVD method.

Furthermore, in the aforesaid method, the first insulating film is formed by the spin coating accompanied by single wafer processing, whereas the second insulating film is formed by the CVD method accompanied by batch processing, whereby the structure of separate apparatus (for example, structure in which the wafer is transferred between these apparatus by using an AGV) is needed, causing a problem in terms of production efficiency and apparatus costs.

Moreover, in the aforesaid method, only pre-drying is performed by heating to the temperature between about 100° C. and about 250° C. after the application of the inorganic SOG solution, and hence the first insulating film also needs to be burned after the formation of the second insulating film, which causes a problem that it is required to select a permeable material as the second insulating film.

SUMMARY OF THE INVENTION

An object of the present invention is to provide an insulating film forming method and an insulating film forming apparatus capable of offering favorable low dielectric constant properties and good adhesion of a first insulating film and a second insulating film.

Another object of the present invention is to provide an insulating film forming method and an insulating film forming apparatus capable of forming the first insulating film and the second insulating film in the same apparatus.

Still another object of the present invention is to provide an insulating film forming method and an insulating film forming apparatus capable of widening the extent of selection of a material for the second insulating film.

To solve the aforesaid problems, an insulating film forming method of the present invention comprises the steps of: (a) applying a first inorganic insulating film material on a substrate; and (b) applying a second organic insulating film material on the applied first insulating film material, and further comprises thermal processing steps each with a plurality of stages at different temperatures between the step (a) and the step (b), and after the step (b) respectively.

According to the present invention, both the first insulating film and the second insulating film are formed through the step of "application of a material" without passing through the step of CVD, whereby low dielectric constant properties are favorable, the adhesion of the first insulating film and the second insulating film is satisfactory, and the first insulating film and the second insulating film can be formed in the same apparatus. Moreover, since thermal processing steps each with a plurality of stages at different temperatures, for example, drying, condensation polymerization, and burning are performed respectively after the application of the first insulating film material and after the application of the second insulating film material, it is unnecessary to burn the first insulating film after the formation of the second insulating film. Hence, it is not necessarily required to select a permeable material as the second insulating film, and consequently the extent of selection of a material for the second insulating film can be widened.

According to an aspect of the present invention, the aforesaid thermal processing steps with a plurality of stages are characterized by being set at a temperature not more than 500° C., whereby disconnection of a wiring pattern formed at a layer lower than the insulating film, and the like can be prevented.

According to an aspect of the present invention, the thermal processing step with a plurality of stages is characterized in that the temperature is raised stepwise. Consequently, for example, drying, condensation polymerization, burning, and the like can be performed efficiently by being allocated to separate heat processing devices.

Therefore, according to an aspect of the present invention, the thermal processing step with a plurality of stages is characterized by comprising at least a thermal processing step for drying a solvent in each of the applied first and second insulating film materials, and a thermal processing step for performing condensation polymerization for the first and second insulating film materials in each of which the solvent is dried.

According to an aspect of the present invention, in order that the thermal processing step at the final stage between the step (a) and the step (b) and the thermal processing step at the final stage after the step (b) are almost the same at least with respect to temperature conditions, processing conditions in the thermal processing step before the final stage between the step (a) and the step (b) and in the thermal processing step before the final stage after the step (b) are set respectively. As a result, the thermal processing step at the final stage between the step (a) and the step (b) and the thermal processing step at the final stage after the step (b) can be performed in the same heat processing device. Especially when the thermal processing step at the final stage is a burning step, the thermal processing temperature is the highest. Thus, it is desirable in terms of the structure of the apparatus and energy to perform the thermal processing step at the final stage between the step (a) and the step (b) and the thermal processing step at the final stage after the step (b) in the same heat processing device.

According to an aspect of the present invention, the first insulating film and the second insulating film are respectively applied on the substrate by a spin coating method in the step (a) and the step (b).

An insulating film forming method of the present invention is characterized by comprising the steps of: (a) applying a first porous insulating film material on a substrate; and (b) applying a second insulating film material such that the second insulating film material is filled in holes made in the surface of the applied first insulating film material and such that the surface after application is flattened, on the applied first insulating film material.

According to the present invention, low dielectric constant properties are satisfactory, the adhesion of the first insulating film and the second insulating film is favorable, the formation of the first insulating film and the second insulating film can be performed in the same apparatus, and in addition, a flatter insulating film can be formed.

An insulating film forming apparatus of the present invention is characterized by integrally comprising: a first coating device for applying a first inorganic insulating film material on a substrate; a second coating device for applying a second organic insulating film material on the applied first insulating film material; a plurality of kinds of thermal processing devices set on different thermal processing conditions respectively, for performing thermal processing for the substrate on which the insulating film materials are applied by the first and second coating devices; and a transfer device for transferring the substrate between these devices.

According to the present invention, low dielectric constant properties are satisfactory, the adhesion of the first insulating film and the second insulating film is favorable, and moreover the first insulating film and the second insulating film can be formed in the same apparatus.

According to an aspect of the present invention, at least one thermal processing device out of the plurality of kinds of thermal processing devices is used in common by both the substrate on which the first insulating film material is applied by the first coating device and the substrate on which the second insulating film material is applied by the second coating device, which is desirable in terms of the structure of the apparatus and energy.

Therefore, according to an aspect of the present invention, the aforesaid thermal processing device for common use is characterized by being set at the highest temperature out of the plurality of kinds of thermal processing devices.

Furthermore, according to an aspect of the present invention, the first and second coating devices respectively apply a first insulating film and a second insulating film on the substrate by a spin coating method.

These objects and still other objects and advantages of the present invention will become apparent upon reading the following specification when taken in conjunction with the accompanying drawings.

DETAILED DESCRIPTION OF THE PREFERRED EMBODIMENTS

The preferred embodiment of the present invention will be described below with reference to the drawings.

Figure 1:
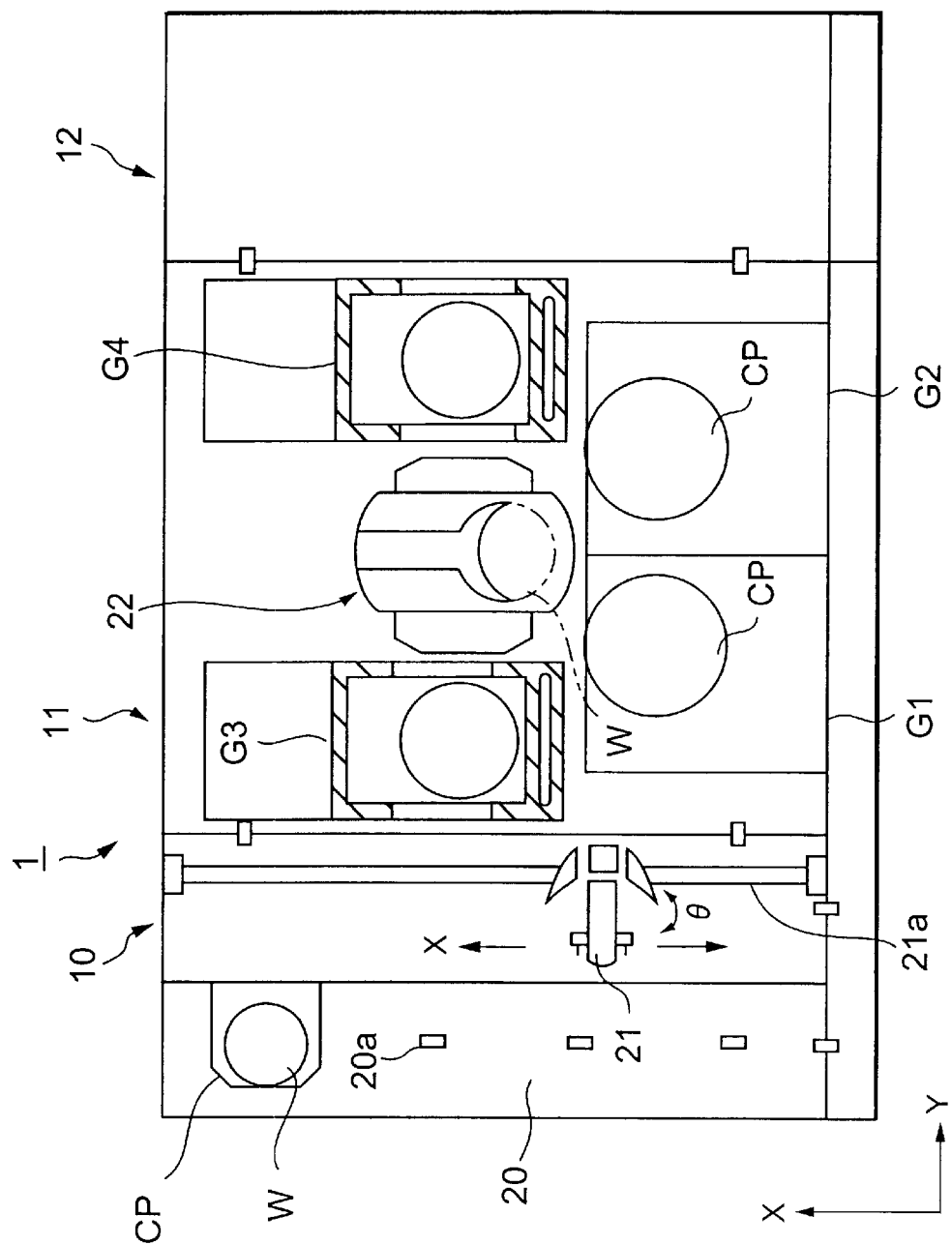
FIG. 1 is a plan view of an SOD processing system according to an embodiment of the present invention.
Figure 2:
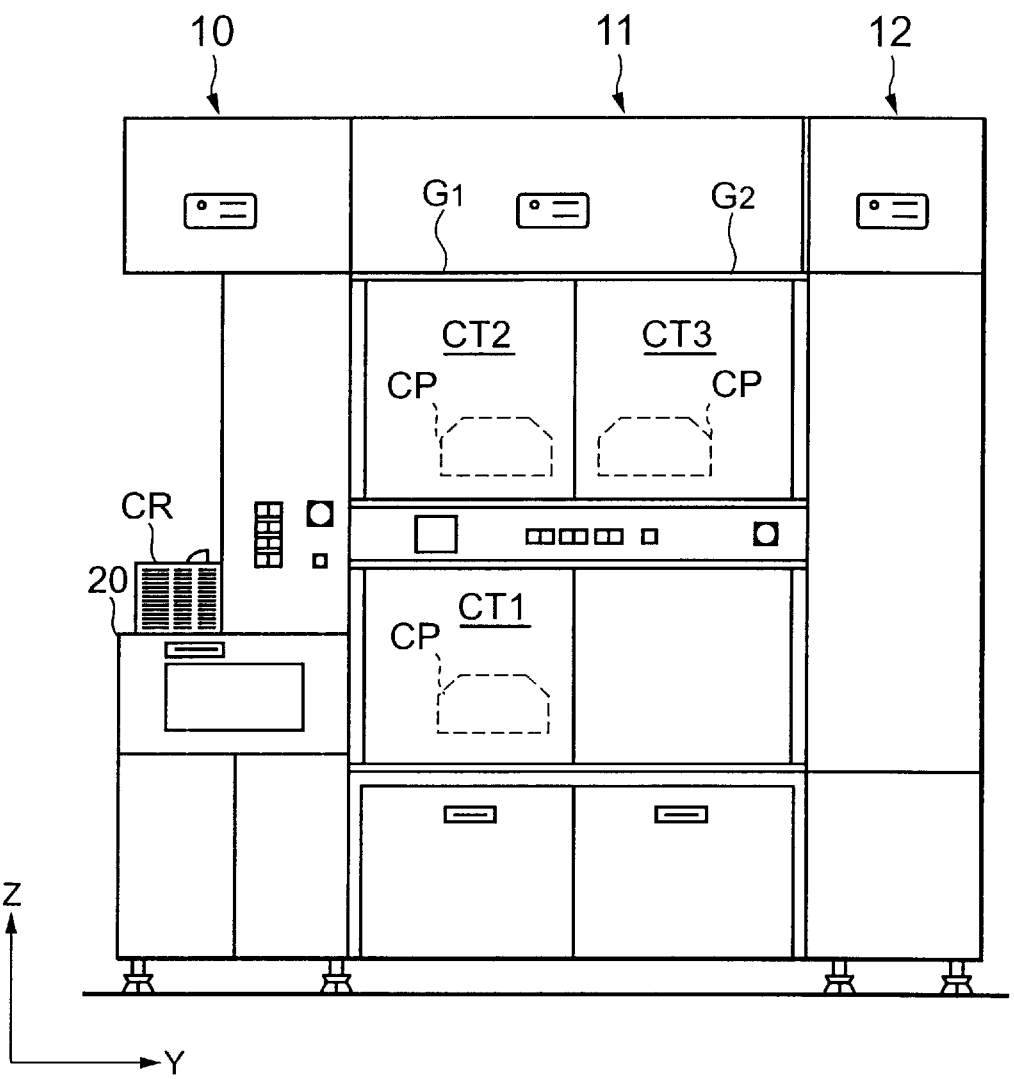
FIG. 2 is a front view of the SOD processing system shown in FIG. 1.
Figure 3:
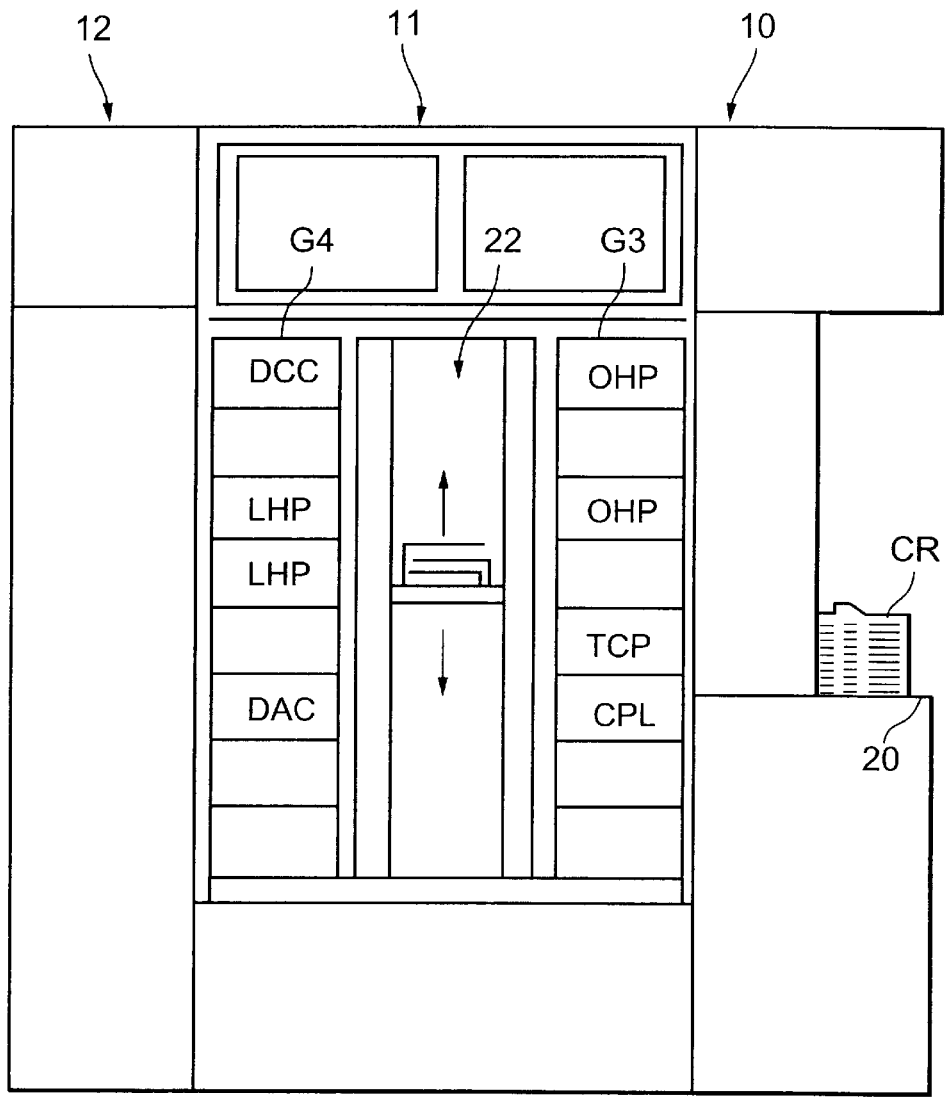
FIG. 3 is a rear view of the SOD processing system shown in FIG. 1.

FIG. 1 to FIG. 3 are diagrams showing the entire structure of an SOD (Spin on Dielectric) processing system according to an embodiment of the present invention, FIG. 1 is a plan view, FIG. 2 is a front view, and FIG. 3 is a rear view.

The SOD processing system 1 has structure in which a cassette block 10 for transferring a plurality of, for example, 25 semiconductor wafers (hereinafter referred to as wafers) W as substrates, as a unit, in a wafer cassette CR from/to the outside into/from the system and carrying the wafer W into/out of the wafer cassette CR, a processing block 11 in which various kinds of processing stations each for performing predetermined processing for the wafers W one by one in an SOD coating process are multi-tiered at predetermined positions, and a cabinet 12 in which a bottle of ammonia water, a bubbler, a drain bottle, and the like required in an aging process are placed are integrally connected.

In the cassette block 10, as shown in FIG. 1, a plurality of, for example, up to four wafer cassettes CR are mounted with respective wafer transfer ports facing the processing block 11 side at positions of projections 20a on a cassette mounting table 20 in a line in an X-direction. A wafer transfer body 21 movable in the direction of arrangement of cassettes (the X-direction) and in the direction of arrangement of wafers housed in the wafer cassette CR (a Z-vertical direction) selectively gets access to each of the wafer cassettes CR. The wafer transfer body 21 is also structured to be rotatable in a θ-direction so as to be able to get access to a transfer and chill plate (TCP) included in a multi-tiered station section of a third group G3 on the processing block 11 side as will be described later.

In the processing block 11, as shown in FIG. 1, a vertical transfer-type main wafer transfer mechanism 22 as a transfer device is disposed in the center thereof. Around the main wafer transfer mechanism 22, all processing stations composing a group or a plurality of groups are multi-tiered. In this embodiment, four groups G1, G2, G3, and G4 each having multi-tiered stations are arranged. Multi-tiered stations of the first and second groups G1 and G2 are arranged side by side on the front side (the lower side in FIG. 1) of the system, multi-tiered stations of the third group G3 are arranged adjacent to the cassette block 10, and multi-tiered stations of the fourth group G4 are arranged adjacent to the cabinet 12.

As shown in FIG. 2, in the first group G1, a first coating processing station (CT1) for supplying an inorganic insulating film material (for example, a company name: Allied Signal Inc., a brand name: Nanoglass) while the wafer W is mounted on a spin chuck in a cup CP and applying the uniform inorganic insulating film material on the wafer W by rotating the wafer W and a second coating processing station (CT2) with the same structure for supplying and applying an organic insulating film material (a company name: Allied Signal Inc., a brand name: HOSP) onto the wafer W are two-tiered from the bottom in order.

In the second group G2, a third coating processing station (CT3) with the same structure as the aforesaid coating processing stations (CT1, 2) for supplying a chemical for exchange such as HMDS, heptane, or the like onto the wafer W and exchanging a solvent in the inorganic insulating film applied on the wafer W for another solvent prior to a drying process is arranged at the upper tier. Incidentally, it is possible to arrange a coating processing station (CT) at the lower tier of the second group G2 as required. Moreover, at the lower tier of the second group G2, a resist solution may be supplied onto the wafer W, on which a layer insulating film, for example, is formed, by the same structure as the aforesaid stations.

As shown in FIG. 3, in the third group G3, two low-oxygen and high-temperature heat processing stations (OHP), a transfer and chill plate (TCP), and a cooling processing station (CPL) are multi-tiered from the top in order. Here the low-oxygen and high-temperature heat processing station (OHP) has a hot plate on which the wafer W is mounted inside a sealable processing chamber, exhausts air from the center of the top portion of the processing chamber while discharging N2 gas uniformly from a hole at the outer periphery of the hot plate, and performs high-temperature heat processing for the wafer W in a low-oxygen atmosphere. The cooling processing station (CPL) has a chill plate on which the wafer W is mounted and performs cooling processing for the wafer W. The transfer and chill plate (TCP) has two-tiered structure with a chill plate for cooling the wafer W at the lower tier and a transfer table at the upper tier and transfers the wafer W from/to the cassette block 10 to/from the processing block 11.

In the fourth group G4, a low-oxygen curing and cooling processing station (DCC), two low-temperature heat processing stations (LHP), and an aging processing station (DAC) are multi-tiered from the top in order. Here the low-oxygen curing and cooling processing station (DCC) has a hot plate and a chill plate inside a sealable processing chamber, performs high-temperature heat processing for the wafer W and cooling processing for the wafer W subjected to the heat processing in a low-oxygen atmosphere in which exchange for N2 is performed. The low-temperature heat processing station (LHP) has a hot plate on which the wafer W is mounted and performs low-temperature heat processing for the wafer W. The aging processing station (DAC) introduces a processing gas ($NH_3+H_2O$) in which ammonia gas and steam are mixed into a sealable processing chamber to perform aging processing for the wafer W, whereby the insulating film material on the wafer W is wet gelatinized.

Figure 4:
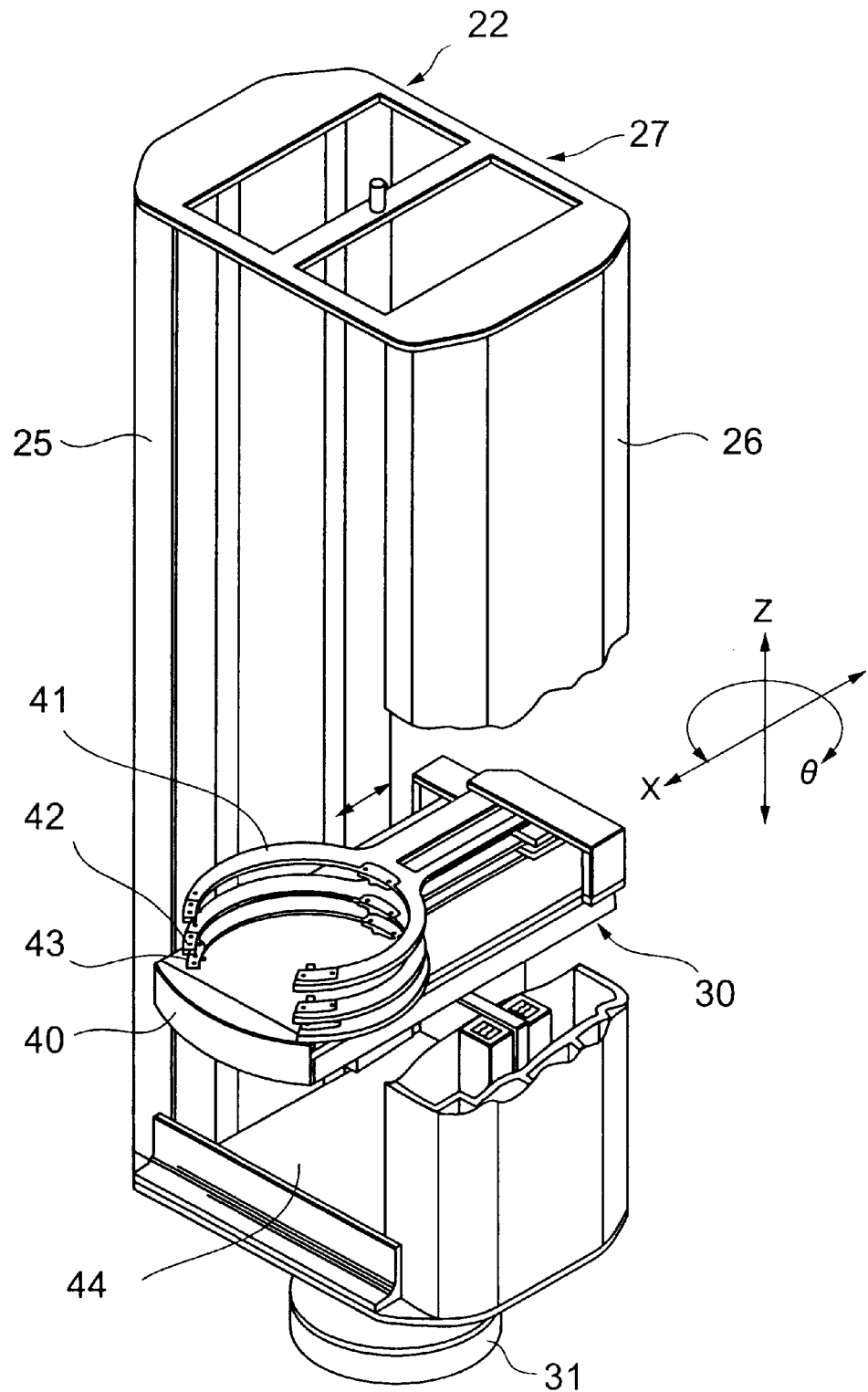
FIG. 4 is a perspective view of a main wafer transfer mechanism in the SOD processing system shown in FIG. 1.

FIG. 4 is a perspective view showing the external appearance of the aforesaid main wafer transfer mechanism 22. This main wafer transfer mechanism 22 is provided with a wafer transfer device 30 which is ascendable and descendable in the vertical direction (the Z-direction) inside a cylindrical supporter 27 composed of a pair of wall portions 25 and 26 which are connected at respective upper ends and lower ends and face each other. The cylindrical supporter 27 is connected to a rotating shaft of a motor 31 and rotated integrally with the wafer transfer device 30 around the aforesaid rotating shaft by rotational driving force of the motor 31. Accordingly, the wafer transfer device 30 is rotatable in the θ-direction. For example, three tweezers are provided on a transfer base 40 of the wafer transfer device 30. These tweezers 41, 42, and 43 each have a shape and a size capable of freely passing through a side opening 44 between both the wall portions 25 and 26 of the cylindrical supporter 27 so as to be movable back and forth along the X-direction. The main wafer transfer mechanism 22 allows the tweezers 41, 42, and 43 to get access to processing stations disposed thereabout to transfer the wafer W from/to each of these processing stations.

Figure 5:
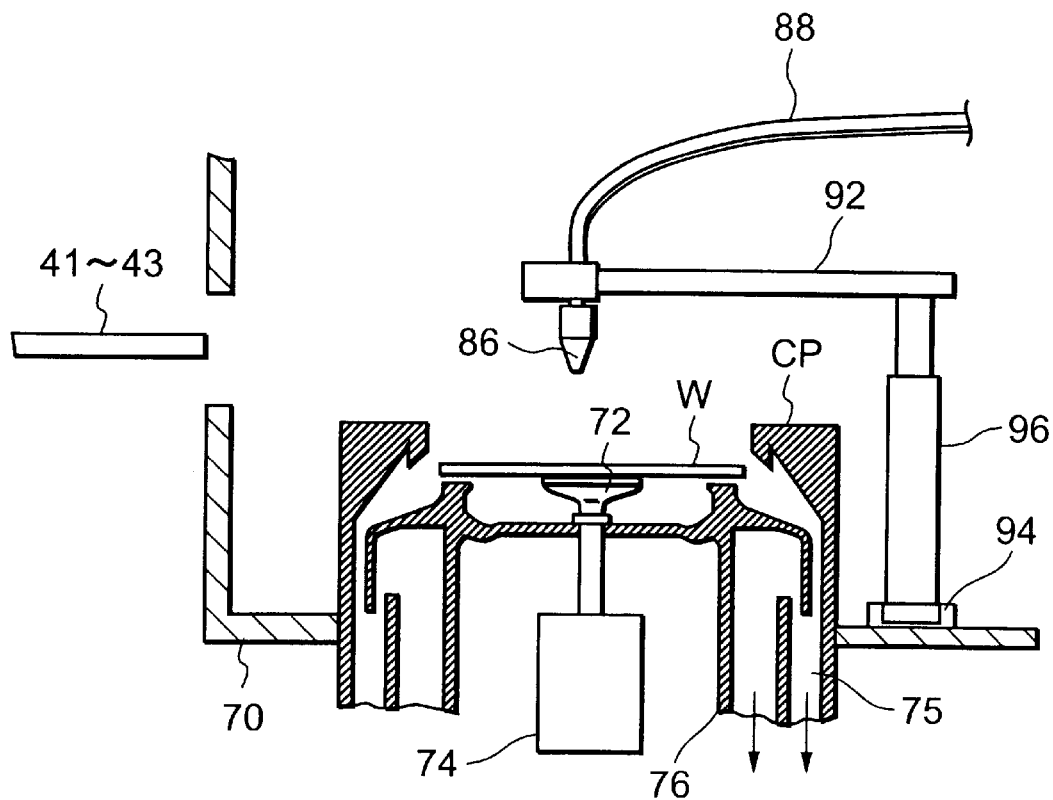
FIG. 5 is a sectional view showing the entire structure of each of a first to third coating processing stations according to the embodiment of the present invention.
Figure 6:
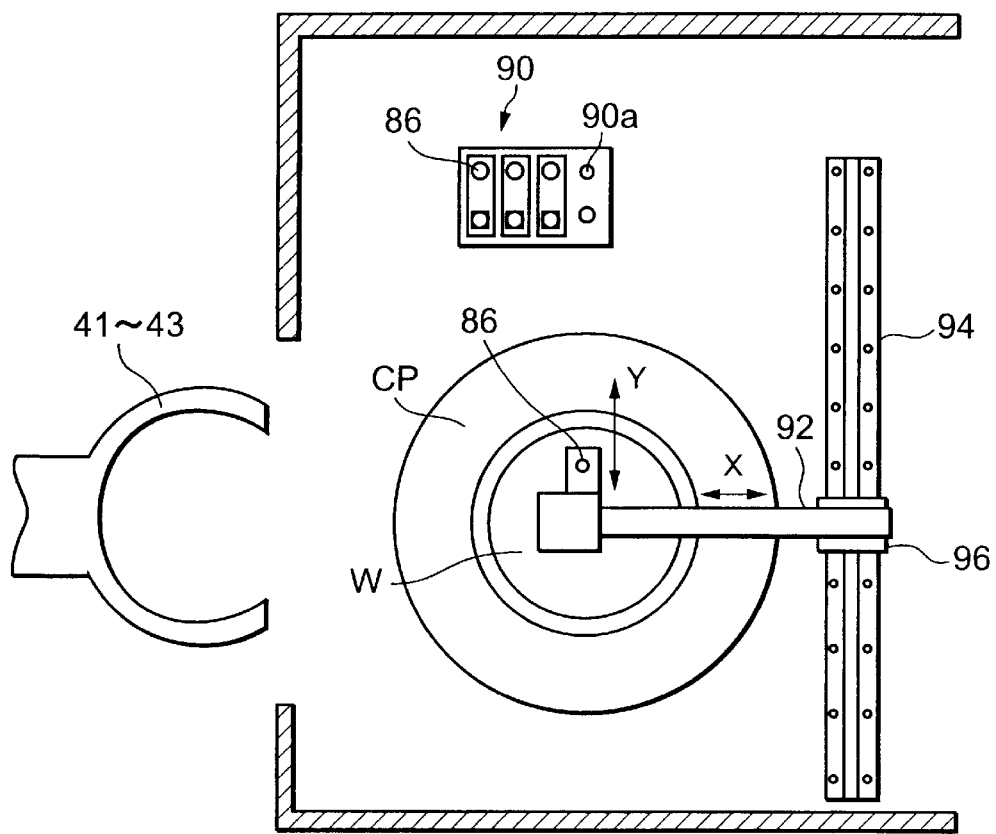
FIG. 6 is a plan view of each of the first to third coating processing stations shown in FIG. 5.

FIG. 5 is an almost sectional view showing the entire structure of each of the first to third coating processing stations (CT1 to CT3), and FIG. 6 is an almost plane view thereof.

These first to third coating processing stations (CT1 to CT3) have the same structure. Namely, in each of these first to third coating processing stations (CT1 to CT3), an annular cup CP is disposed at the center of a unit base, and a spin chuck 72 is disposed therein. The spin chuck 72 is structured to rotate by the rotational driving force of a drive motor 74 while fixedly holding the wafer W by vacuum suction. The drive motor 74 is arranged to be able to move up and down by a cylinder the illustration of which is omitted, thereby allowing the spin chuck 72 to ascend and descend. Moreover, a drain hole 75 for drainage and a drain hole 76 for exhaust are provided separately in the cup CP.

A solution supply nozzle 86 for supplying a solution (the inorganic insulating film material in the first coating processing station (CT1), the organic insulating film material in the second coating processing station (CT2), or the chemical for exchange in the third coating processing station (CT3)) onto the front face of the wafer W is connected to a solution supply section (not illustrated) by a processing solution supply pipe 88. The solution supply nozzle 86 is detachably attached to a forward end portion of a nozzle scan arm 92 at a nozzle waiting section 90 located outside the cup CP, and moved to a predetermined solution discharge position set above the spin chuck 72. The nozzle scan arm 92 is attached to an upper end portion of a vertical supporting member 96 horizontally movable on guide rails 94 laid in one direction (the Y-direction) on a unit base plate 70 and moves in the Y-direction integrally with the vertical supporting member 96 by means of a Y-directional drive mechanism not illustrated.

The nozzle scan arm 92 is movable also in the X-direction perpendicular to the Y-direction so that the solution supply nozzle 86 is selectively attached thereto at the nozzle waiting section 90, and moves in the X-direction by means of an X-directional drive mechanism not illustrated.

A discharge port of the solution supply nozzle 86 is inserted in a port 90a of a solvent atmosphere chamber at the nozzle waiting section 90 and exposed to an atmosphere of a solvent therein, whereby the solution at the tip of the nozzle is not solidified nor deteriorated. Further, a plurality of solution supply nozzles 86, 86, . . . are provided, and from among these nozzles, the appropriate one is chosen depending on the kind of solution.

Figure 7:
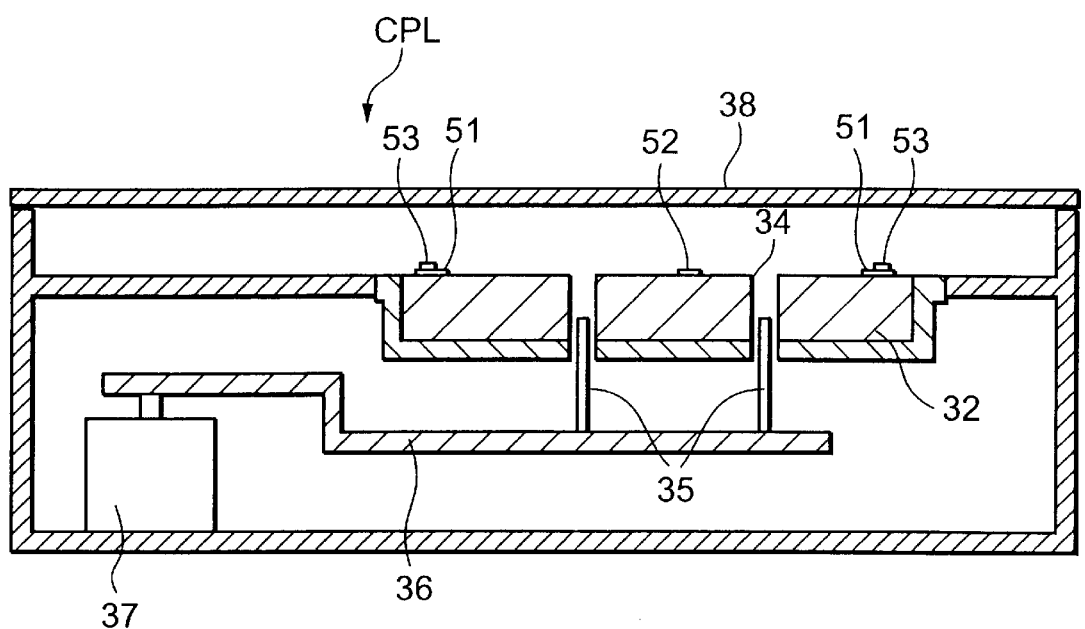
FIG. 7 is a sectional view of a cooling processing station according to the embodiment of the present invention.
Figure 8:
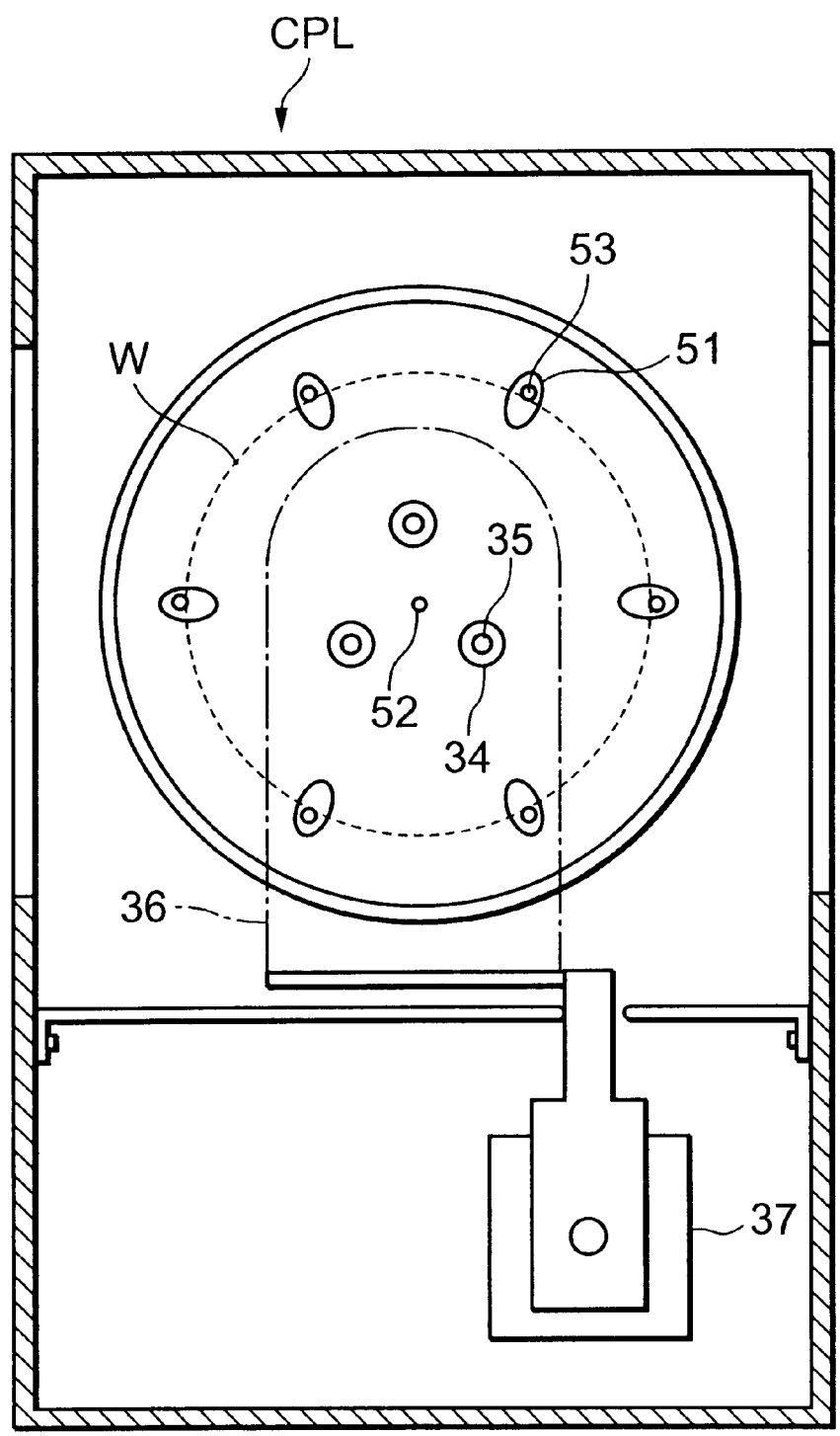
FIG. 8 is a plan view of the cooling processing station shown in FIG. 7.

FIG. 7 is a sectional view of the aforesaid cooling processing station (CPL), and FIG. 8 is the plan view thereof.

A chill plate 32 as a plate for performing cooling processing for the wafer W is disposed almost exactly at the center of the cooling processing station (CPL).

This chill plate 32 has a circular shape, for example, with a diameter slightly larger than that of the wafer W. A servo module not illustrated is embedded in the chill plate 32, and the cooling of the chill plate 32 by the servo module is performed by letting cooling water for cooling the servo module flow through a cooling flow path provided close to the servo module.

Through-holes 34 are bored through the front face and the rear face of the chill plate 32 at a plurality of, for example, three points. A plurality of, for example, three supporting pins 35 for delivering the wafer W are inserted into these through-holes 34 so as to freely protrude therefrom and retract thereinto. These supporting pins 35 are coupled together on the rear face side of the chill plate 32 by a coupling member 36 disposed on the rear face side of the chill plate 32. The coupling member 36 is connected to a raising and lowering cylinder 37 situated on the rear face side of the chill plate 32. The supporting pins 35 protrude from and retract into the front face of the chill pate 32 by the raising and lowering operation of the raising and lowering cylinder 37. The supporting pins 35 receives and sends the wafer W from/to the main wafer transfer mechanism 22 while protruding from the front face of the chill plate 32. After receiving the wafer W from the main wafer transfer mechanism 22, the supporting pins 35 lower and retract into the chill plate 32, whereby the wafer W is subjected to cooling processing on the chill plate 32.

A cooling cover 38 is placed above the chill plate 32. Incidentally, it is also possible to form a waiting section of the wafer W by providing supporting pins on the upper face of this cooling cover 38.

Further, in this cooling processing station (CPL), proximity sheets 51 for holding the wafer W while the wafer W is lifted off the chill plate 32 without being closely attached to the chill plate 32 are disposed at a plurality of, for example, six points at the outer peripheral portion of a wafer W mounting position. Furthermore, a proximity pin 52 is disposed at the center of the wafer W mounting position.

Each of the proximity sheets 51 extends toward the outside of the wafer W mounting position, and a guide 53 for guiding a substrate is disposed at a position to which each of the proximity sheets 51 extends.

Figure 9:
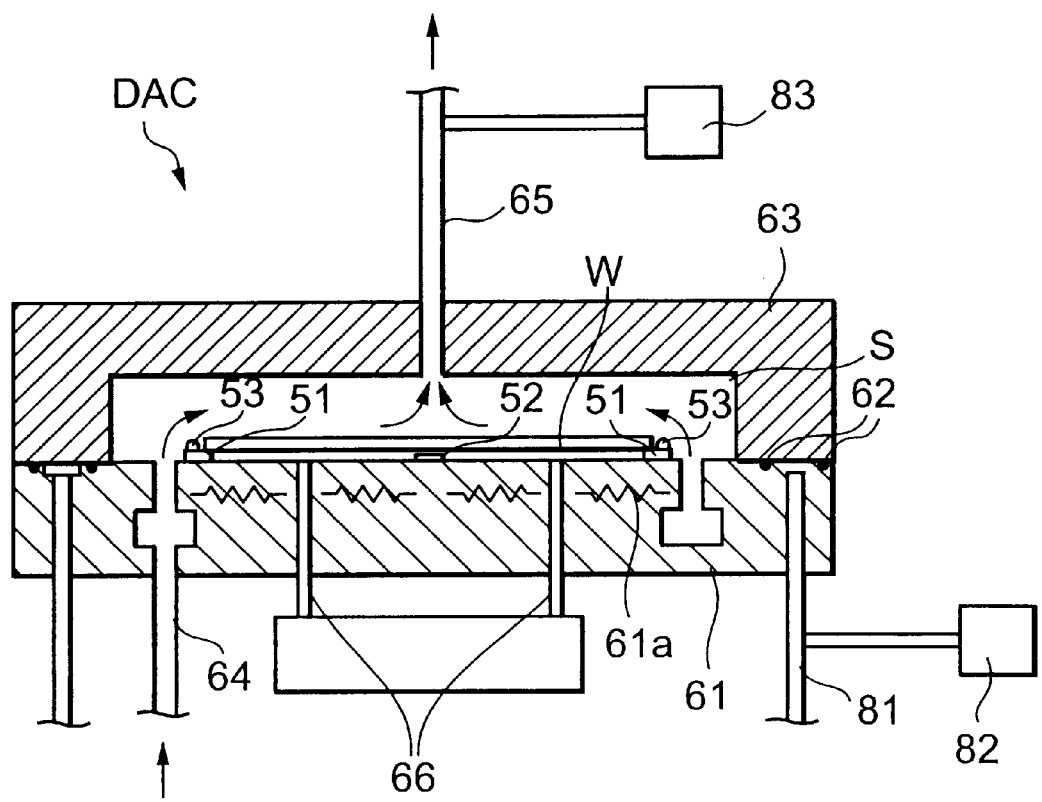
FIG. 9 is a sectional view of an aging processing station according to the embodiment of the present invention.

FIG. 9 is a sectional view of the aforesaid aging processing station (DAC).

The aging processing station (DAC) includes a hot plate 61, for example, made of ceramics, with a built-in heater 61a, a cover 63 which is closely attached to a peripheral edge portion of the hot plate 61 with seal members 62 between them so that a space S constituting a processing chamber is formed above the hot plate 61 and which is attached to and detached from the hot plate 61, a gas supply passage 64 the supply port of which is formed in the front surface of the hot plate 61 so as to surround the wafer placed on the hot plate 61, an exhaust passage 65 the inlet port of which is formed at the center of the cover 63, and three raising and lowering pins 66 for raising and lowering the wafer W between the hot plate 61 and a position above the hot plate 61.

In this aging processing station (DAC), ammonia is vaporized by the bubbler and a mass-flow controller (not illustrated) in the side cabinet 12, and supplied into the processing chamber S via the aforesaid gas supply passage 64.

Exhaust air from the exhaust passage 65 is trapped by a drain tank (not illustrated) in the side cabinet 12.

Figure 10:
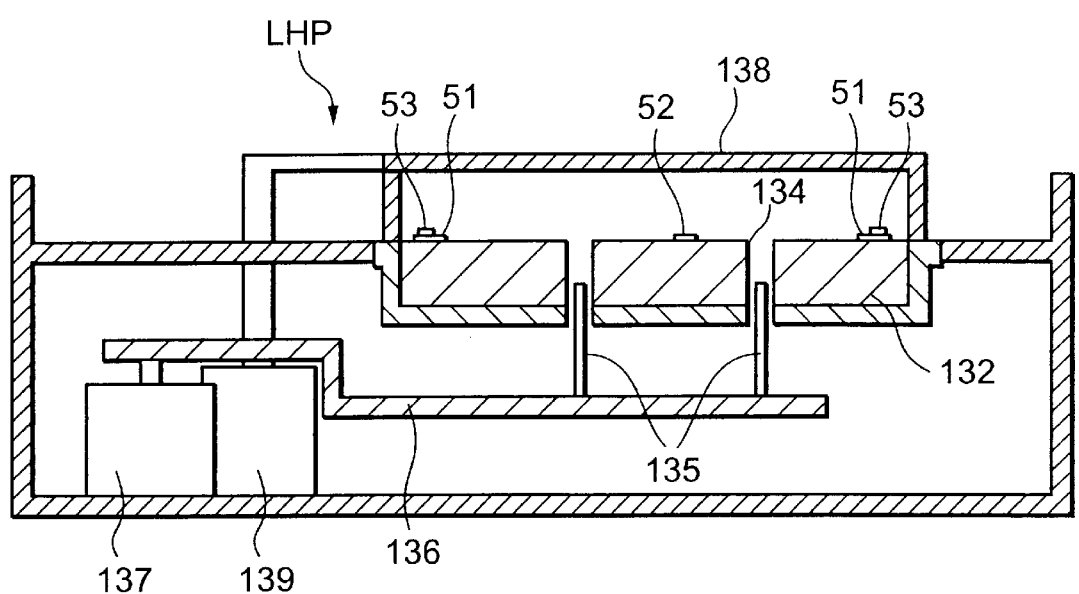
FIG. 10 is a sectional view of a low-temperature heat processing station according to the embodiment of the present invention.

FIG. 10 is a sectional view of the aforesaid low-temperature heat processing station (LHP).

A hot plate 132 as a plate for performing heat processing for the wafer W is disposed almost exactly at the center of the low-temperature heat processing station (LHP). A heater the illustration of which is omitted is embedded in this hot plate 132.

Through-holes 134 are bored through the front face and the rear face of the hot plate 132 at a plurality of, for example, three points. A plurality of, for example, three supporting pins 135 for delivering the wafer W are inserted into these through-holes 134 so as to freely protrude therefrom and retract thereinto. These supporting pins 135 are coupled together on the rear face side of the hot plate 132 by a coupling member 136 disposed on the rear face side of the hot plate 132. The coupling member 136 is connected to a raising and lowering cylinder 137 situated on the rear face side of the hot plate 132. The supporting pins 135 protrude from and retract into the front face of the hot pate 132 by the raising and lowering operation of the raising and lowering cylinder 137.

An ascent/descent cover 138 is placed above the hot plate 132. The ascent/descent cover 138 can be raised and lowered by a raising and lowering cylinder 139. When the ascent/descent cover 138 descends as illustrated, an enclosed space for performing heat processing is formed between the ascent/descent cover 138 and the hot plate 132.

Figure 11:
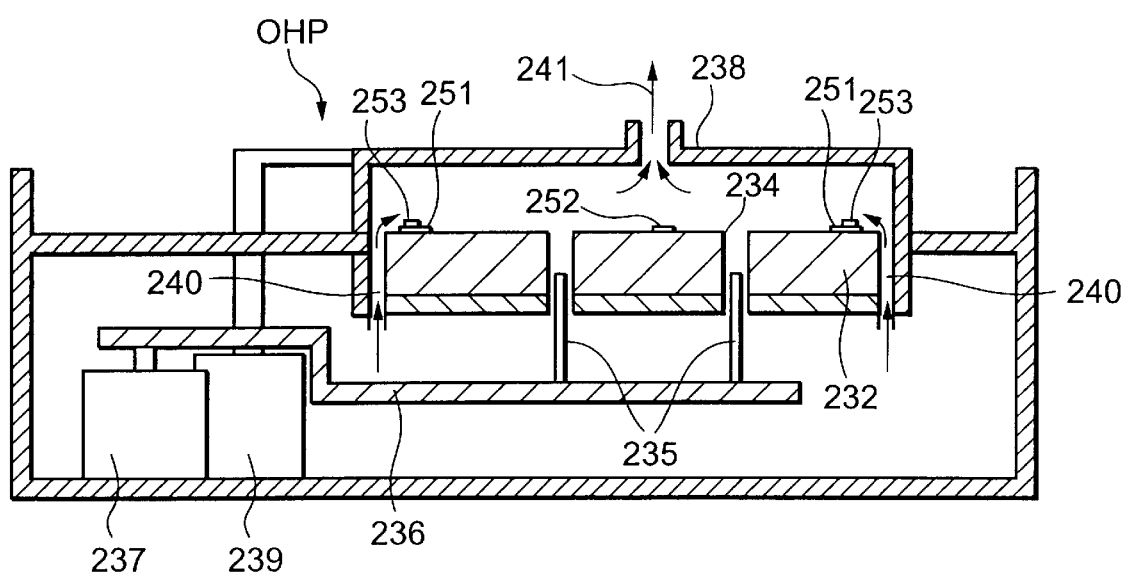
FIG. 11 is a sectional view of a low-oxygen and high-temperature heat processing station according to the embodiment of the present invention.

FIG. 11 is a sectional view of the aforesaid low-oxygen and high-temperature heat processing station (OHP).

A hot plate 232 as a plate for performing heat processing for the wafer W is disposed almost exactly at the center of the low-oxygen and high-temperature heat processing station (OHP). A heater not illustrated is embedded in this hot plate 232.

Through-holes 234 are bored through the front face and the rear face of the hot plate 232 at a plurality of, for example, three points. A plurality of, for example, three supporting pins 235 for delivering the wafer W are inserted into these through-holes 234 so as to freely protrude therefrom and retract thereinto. These supporting pins 235 are coupled together on the rear face side of the hot plate 232 by a coupling member 236 disposed on the rear face side of the hot plate 232. The coupling member 236 is connected to a raising and lowering cylinder 237 situated on the rear face side of the hot plate 232. The supporting pins 235 protrude from and retract into the front face of the hot pate 232 by the raising and lowering operation of the raising and lowering cylinder 237.

An ascent/descent cover 238 is placed above the hot plate 232. The ascent/descent cover 338 can be raised and lowered by the raising and lowering cylinder 239. When the ascent/descent cover 238 descends as illustrated, an enclosed space for performing heat processing is formed between the ascent/descent cover 238 and the hot plate 232.

Further, high-temperature heat processing is performed for the wafer W in a low-oxygen atmosphere by exhausting air from an exhaust port 241 in the center of the ascent/descent cover 238 while discharging $N_2$ gas uniformly from a hole 240 at the outer periphery of the hot plate 232.

Figure 12:
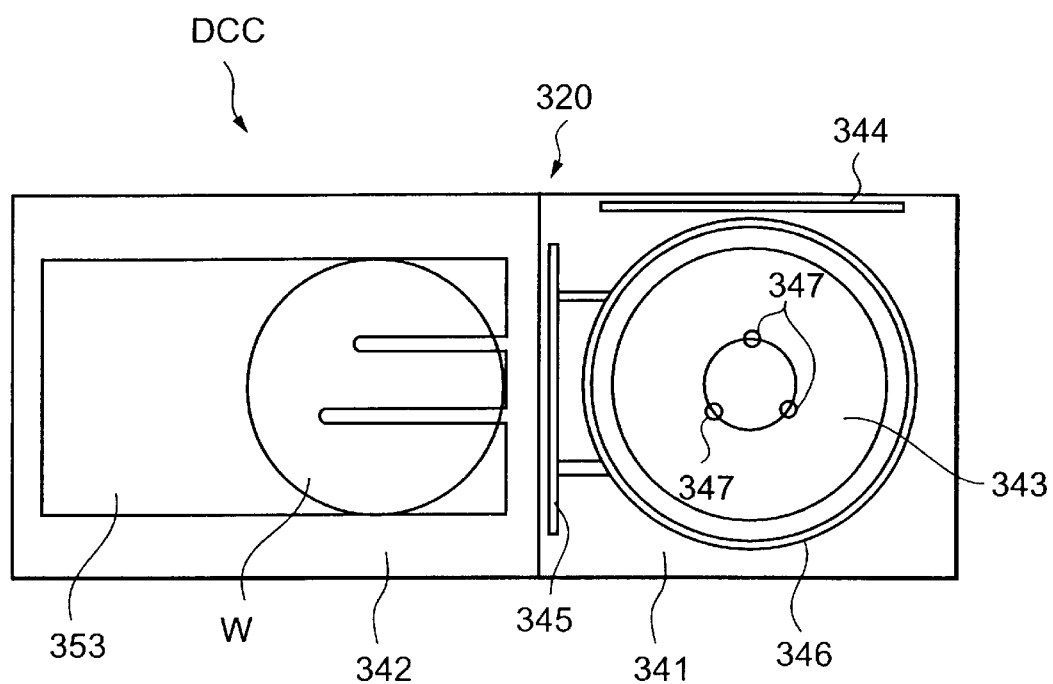
FIG. 12 is a plan view of a low-oxygen curing and cooling processing station according to the embodiment of the present invention.
Figure 13:
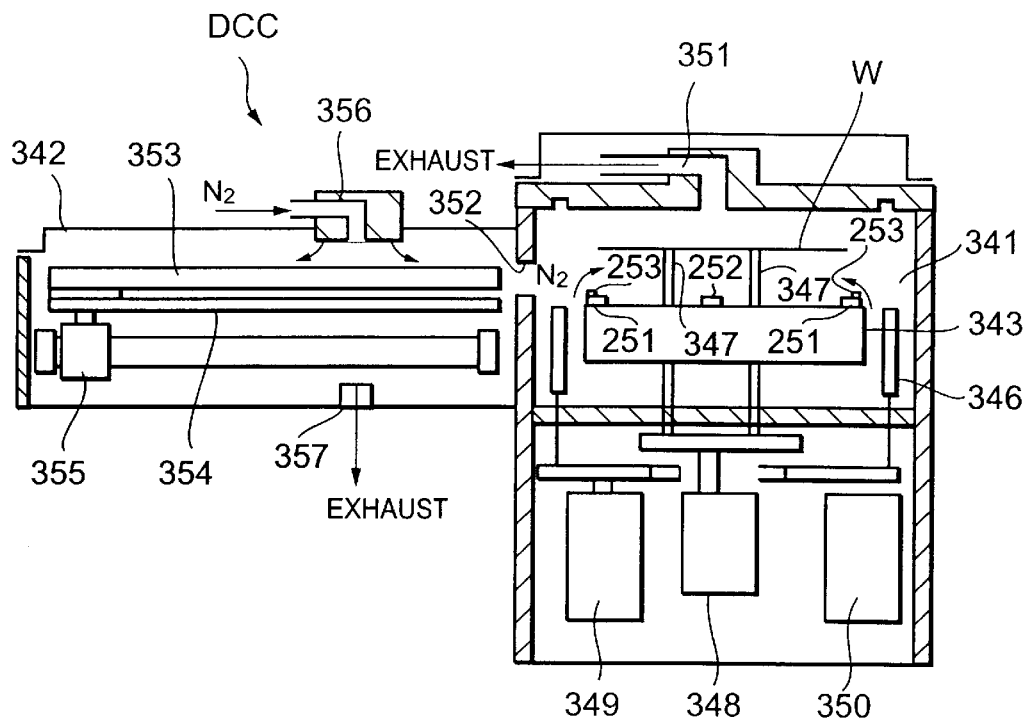
FIG. 13 is a sectional view of the low-oxygen curing and cooling processing station shown in FIG. 12.

FIG. 12 is a plan view of the aforesaid low-oxygen curing and cooling processing station (DCC), and FIG. 12 is a sectional view thereof.

The low-oxygen curing and cooling processing station (DCC) has a heat processing chamber 341 and a cooling processing chamber 342 provided adjacent thereto, and the heat processing chamber 341 has a hot plate 343 the set temperature of which can be 200° C. to 470° C. The low-oxygen curing and cooling processing station (DCC) further has a first gate shutter 344 which is opened and shut when the wafer W is transferred from/to the main wafer transfer mechanism 22, a second gate shutter 345 for opening and shutting a portion between the heat processing chamber 341 and the cooling processing chamber 342, and a ring shutter 346 which is raised and lowered together with the second gate shutter 345 while surrounding the wafer W around the hot plate 343. Moreover, in the hot plate 343, three supporting pins 347 for raising and lowering the wafer W while the wafer W is mounted thereon are provided to be ascendable and descendable. It should be mentioned that a shielding screen may be provided between the hot plate 343 and the ring shutter 346.

Provided below the heat processing chamber 341 are a raising and lowering mechanism 348 for raising and lowering the aforesaid three supporting pins 347, a raising and lowering mechanism 349 for raising and lowering the ring shutter 346 together with the second gate shutter 345, and a raising and lowering mechanism 350 for raising and lowering the first gate shutter 344 to open and shut it.

The heat processing chamber 341 is structured so that an inert gas such as $N_2$ is supplied thereinto from a supply source not illustrated, and that air therein is exhausted through an exhaust pipe 351. The atmosphere in the heat processing chamber 341 is maintained at a low-oxygen concentration (for example, 50 ppm or less) by exhausting air while supplying the inert gas as described above.

The heat processing chamber 341 and the cooling processing chamber 342 communicate with each other via a communicating port 352, and a chill plate 353 for cooling the wafer W while the wafer W is mounted thereon is structured to be movable in a horizontal direction along a guide plate 354 by means of a moving mechanism 355. Thereby, the chill plate 352 can get into the heat processing chamber 341 through the communicating port 352, receives the wafer W which has been heated by the hot plate 343 in the heat processing chamber 341 from the supporting pins 347, carries the wafer W into the cooling processing chamber 342, and returns the wafer W to the supporting pins 347 after cooling the wafer W.

Moreover, the cooling processing chamber 342 is structured so that an inert gas such as $N_2$ or the like is supplied thereinto via a supply pipe 356 and so that air therein is exhausted to the outside via an exhaust pipe 357, whereby the atmosphere in the cooling processing chamber 342 is maintained at a low oxygen concentration (for example, 50 ppm or less), similarly to the heat processing chamber 341.

Figure 14:
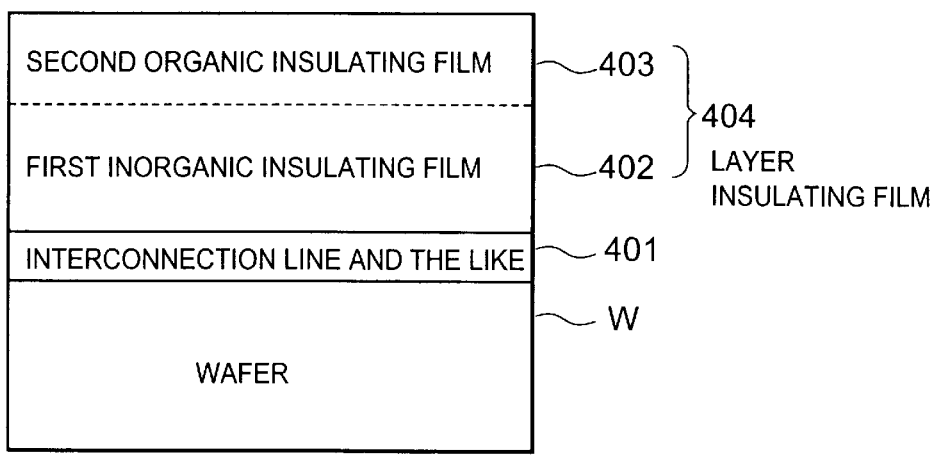
FIG. 14 is a diagram showing the structure of a layer insulating film formed by the process of the present invention.

The SOD system 1 according to this embodiment is structured as above. In this SOD system 1, as shown in FIG. 14, a layer insulating film 404 composed of two layers is formed by first forming a first inorganic insulating film 402 on the wafer W on which, for example, an interconnection line 401 and the like are formed, and then forming a second organic insulating film 403 on the first insulating film 402. In other words, the layer insulating film 404 composed of two layers are formed by first forming the first insulating film 402 by applying a first porous insulating film material on the wafer W, and then forming the second insulating film 403 on the applied first insulating film material by applying a second insulating film material such that the second insulating film material is filled in holes made in the surface of the applied first insulating film material and such that the surface after application is flattened. As a result, the layer insulating film 404 with favorable low dielectric constant properties and a flat surface. Incidentally, if the second organic insulating film is formed on the first inorganic insulating film as described above, it is naturally suitable that some insulating film is formed at a layer lower or upper than these insulating films.

Figure 15:
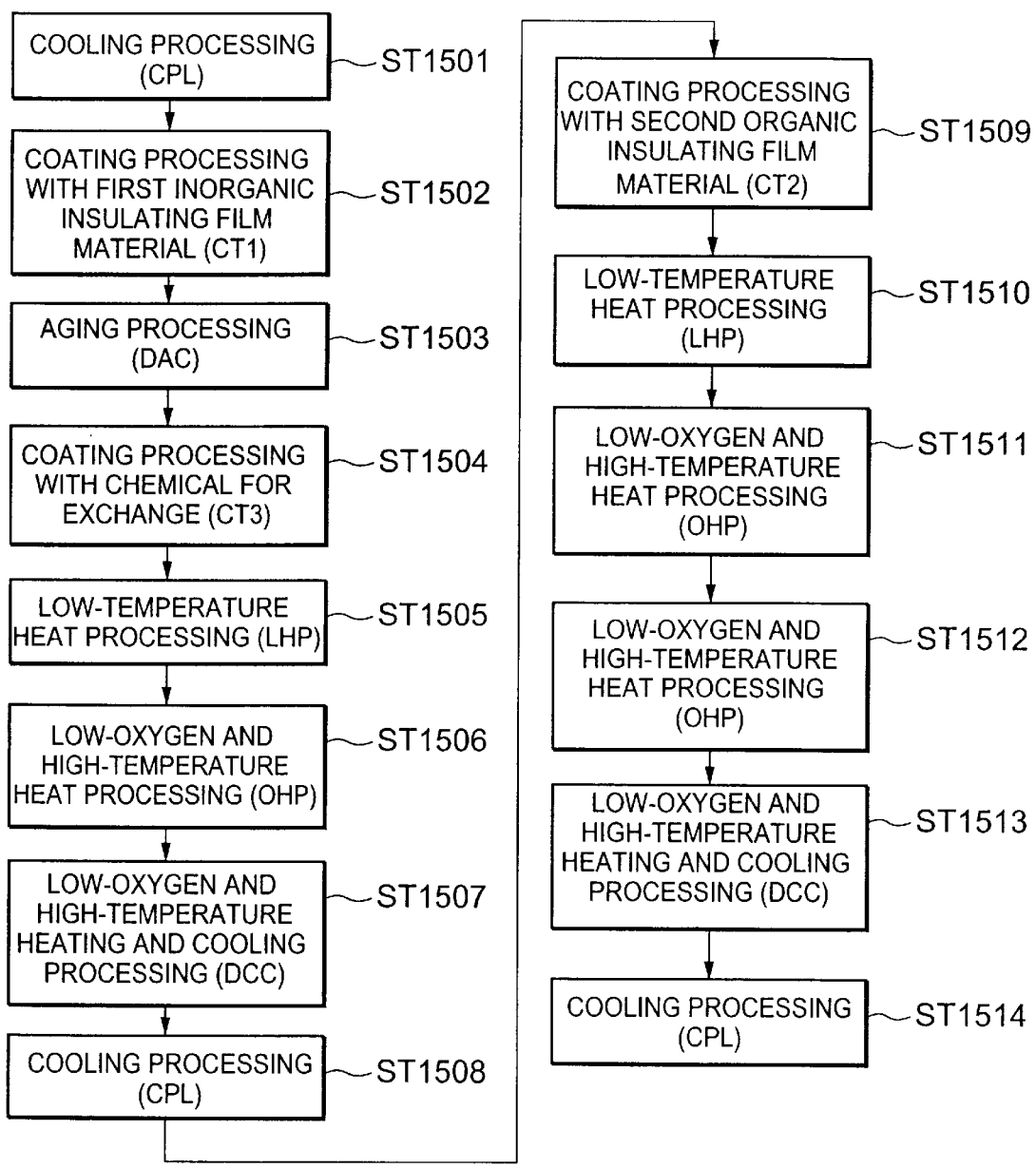
FIG. 15 is a chart showing the flow of processing in the SOD system shown in FIG. 1.

FIG. 15 shows processing flow in the SOD system 1 for forming the aforesaid layer insulating film 404 composed of two layers, and the operation of the system will be explained below based on this processing flow.

First, in the cassette block 10, the unprocessed wafer W is transferred from the wafer cassette CR to the transfer table in the transfer and chill plate (TCP) included in the third group G3 on the processing block 11 side by means of the wafer transfer body 21.

The wafer W transferred to the transfer table in the transfer and chill plate (TCP) is transferred to the cooling processing station (CPL) by means of the main wafer transfer mechanism 22. In the cooling processing station (CPL), for example, the wafer W is cooled to about 23° C. (step 1501).

The wafer W which has undergone the cooling processing in the cooling processing station (CPL) is transferred to the first coating processing station (CT1) via the main wafer transfer mechanism 22. In the first coating processing station (CT1), the first inorganic insulating film material, for example, with a thickness between about 300 nm and about 1100 nm, and more preferably a thickness of about 700 nm, is applied on the wafer W (step 1502).

The wafer W on which the fist inorganic insulating film material has been applied in the first coating processing station (CT1) is transferred to the aging processing station (DAC) via the main wafer transfer mechanism 22. In the aging processing station (DAC), gas ($NH_3+H_2O$) is introduced into the processing chamber and the wafer W is subjected to aging processing, whereby the first inorganic insulating film material on the wafer W is gelatinized (step 1503).

The wafer W which has undergone the aging processing in the aging processing station (DAC) is transferred to the third coating processing station (CT3) via the main wafer transfer mechanism 22. In the third coating processing station (CT3), the chemical for exchange is supplied onto the wafer W, and processing for exchanging a solvent in the insulating film applied onto the wafer for another solvent is performed (step 1504).

The wafer W which has undergone the exchange processing in the third coating processing station (CT3) is transferred to the low-temperature heat processing station (LHP) by means of the main wafer transfer mechanism 22. In the low-temperature processing station (LHP), the wafer W undergoes low-temperature heat processing, for example, at a temperature between 100° C. and 185° C., and more preferably at about 175° C., for about 60 seconds (step 1505).

The wafer W which has undergone the low-temperature heat processing in the low-temperature heat processing station (LHP) is transferred to the low-oxygen and high-temperature heat processing station (OHP) by means of the main wafer transfer mechanism 22. In a low-oxygen atmosphere inside the low-oxygen and high-temperature heat processing station (OHP), for example, the wafer W undergoes high-temperature heat processing at a temperature between 100° C. and 350° C., and more preferably at about 310° C., for about 60 seconds (step 1506).

The wafer W which has undergone the high-temperature heat processing in the low-oxygen and high-temperature heat processing station (OHP) is transferred to the low-oxygen curing and cooling processing station (DCC) by means of the main wafer transfer mechanism 22. In a low-oxygen atmosphere inside the low-oxygen curing and cooling processing station (DCC), for example, the wafer W undergoes high-temperature heat processing at a temperature between 400° C. and 470° C., and more preferably at about 450° C., for about 60 seconds, and then cooling processing, for example, at about 23° C. (step 1507).

The wafer W which has undergone the processing in the low-oxygen curing and cooling processing station (DCC) is transferred to the cooling processing station (CPL) by the main wafer transfer mechanism 22. In the cooling processing station (CPL), for example, the wafer W is cooled to about 23° C. (step 1508).

The wafer W which has undergone the cooling processing in the cooling processing station (CPL) is transferred to the second coating processing station (CT2) via the main wafer transfer mechanism 22. In the second coating processing station (CT2), for example, the second organic insulating film material with a thickness between about 200 nm and about 500 nm, and more preferably a thickness of about 300 nm, is applied on the wafer W (step 1509).

The wafer W on which the second organic insulating film material has been applied in the second coating processing station (CT2) is transferred to the low-temperature heat processing station (LHP) by means of the main wafer transfer mechanism 22. In the low-temperature heat processing station (LHP), for example, the wafer W undergoes low-temperature heat processing at a temperature between 100° C. and 185° C., and more preferably at about 150° C., for about 60 seconds (step 1510).

The wafer W which has undergone the low-temperature heat processing in the low-temperature heat processing station (LHP) is transferred to the low-oxygen and high-temperature heat processing station (OHP) by means of the main wafer transfer mechanism 22. In the low-oxygen atmosphere inside the low-oxygen and high-temperature heat processing station (OHP), for example, the wafer W undergoes high-temperature heat processing, for example, at a temperature between 100° C. and 350° C., and more preferably at about 200° C., for about 60 seconds (step 1511).

The wafer W which has undergone the high-temperature heat processing in the low-oxygen and high-temperature heat processing station (OHP) is transferred to another low-oxygen and high-temperature heat processing station (OHP) the temperature of which is set at a higher temperature by the main wafer transfer mechanism 22. In a low-oxygen atmosphere inside this low-oxygen and high-temperature heat processing station (OHP), the wafer W undergoes high-temperature heat processing at about 350° C. for about 60 seconds (step 1512).

The wafer W which has undergone the high-temperature heat processing in the low-oxygen and high-temperature heat processing station (OHP) is transferred to the low-oxygen curing and cooling processing station (DCC) by means of the main wafer transfer mechanism 22. In the low-oxygen atmosphere inside the low-oxygen curing and cooling processing station (DCC), the wafer W undergoes high-temperature heat processing at a temperature between 400° C. and 470° C., and more preferably at about 450° C, for about 60 seconds, and then cooling processing, for example, at about 23° C. (step 1513).

The wafer W which has undergone the processing in the low-oxygen curing and cooling processing station (DCC) is transferred to the cooling processing station (CPL) by the main wafer transfer mechanism 22. In the cooling processing station (CPL), the wafer W is cooled to, for example, about 23° C. (step 1514).

The wafer W which has undergone the cooling processing in the cooling processing station (CPL) is transferred to the wafer cassette CR via the main wafer transfer mechanism 22, the transfer and chill plate (TCP), and the wafer transfer body 21.

As described above, the SOD processing system 1 of this embodiment, both of the first insulating film 402 and the second insulating film 403 are formed by a spin coating method, whereby the formation of the first insulating film 402 and the second insulating film 403 can be performed in the same SOD processing system 1.

Figure 16:
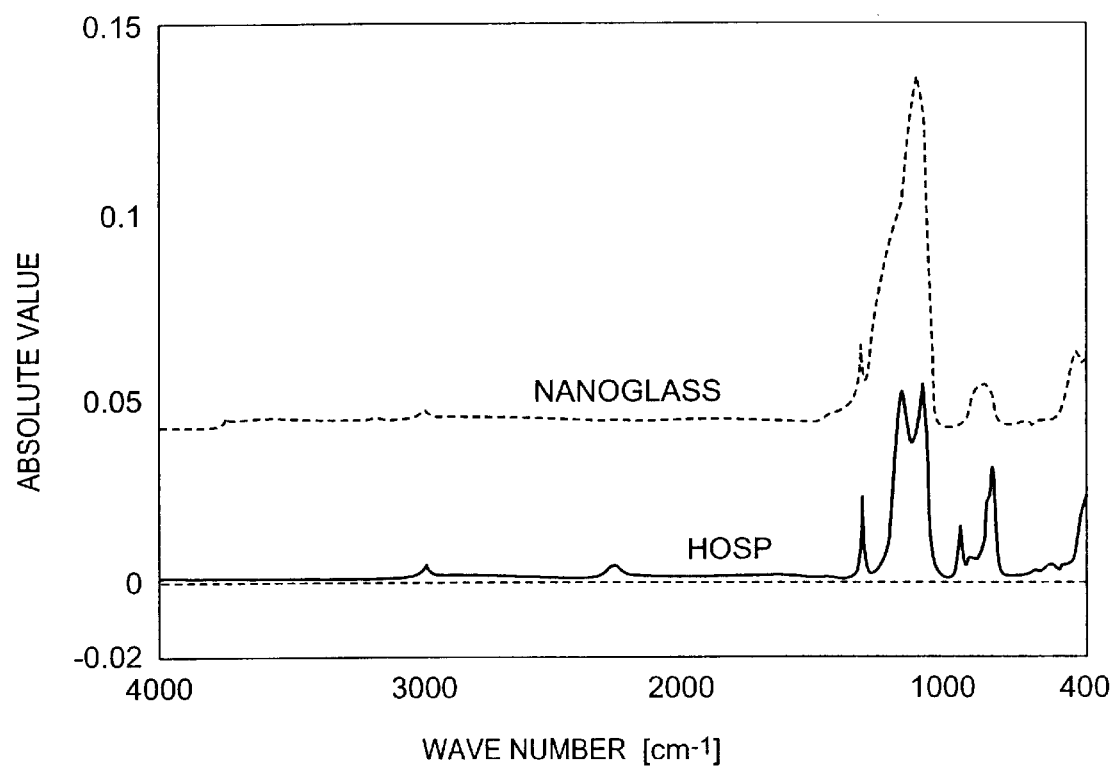
FIG. 16 is a diagram showing a result (a first result) of an experiment carried out for confirming the effect of the present invention.
Figure 17:
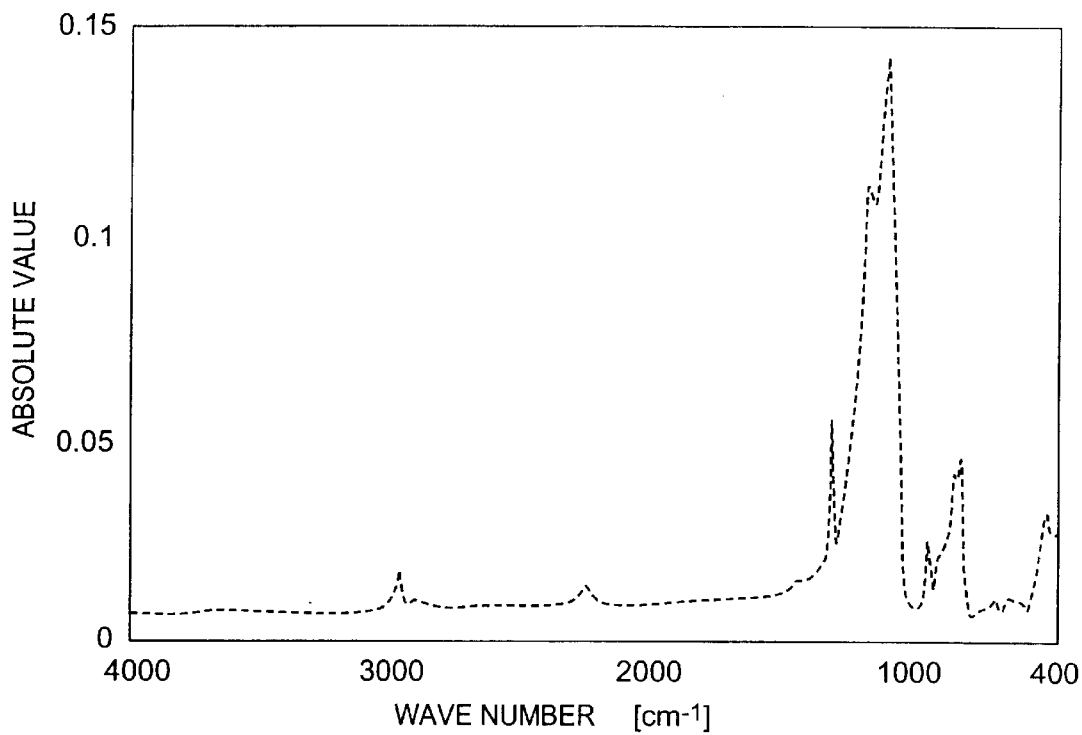
FIG. 17 is a diagram showing a result (a second result) of an experiment carried out for confirming the effect of the present invention.
Figure 18:
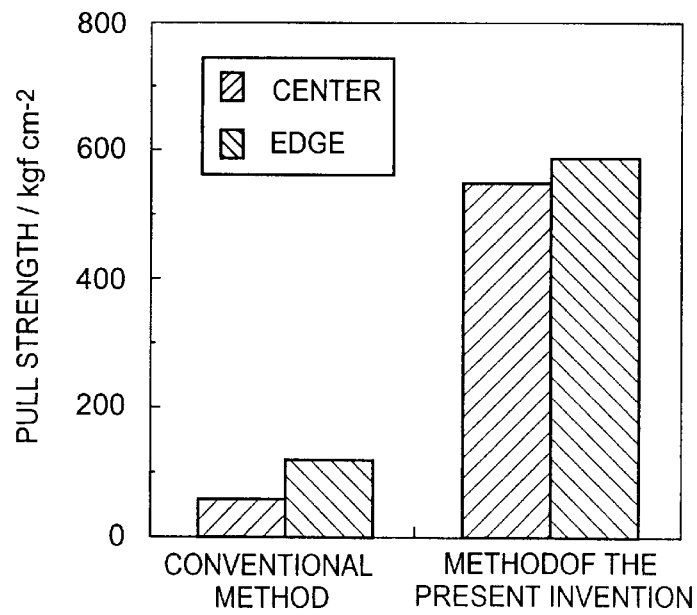
FIG. 18 is a diagram showing a result (a third result) of an experiment carried out for confirming the effect of the present invention.

Moreover, the aforesaid formation of both of the first insulating film 402 and the second insulating film 403 by the spin coating method can provide favorable low dielectric constant properties and good adhesion of the first insulating film and the second insulating film. FIG. 16 shows an FT-IR spectrum in the case of the first insulating film 402 only and an FT-IR spectrum in the case of the second insulating film 403 only. FIG. 17 shows an FT-IR spectrum in the case where the second insulating film 403 is piled on the first insulating film 402. The spectrum shown in FIG. 17 is the sum of respective spectra in FIG. 16, which indicates that no unnecessary reaction is caused by the process of the present invention. This means that low dielectric properties are favorable. Moreover, FIG. 18 shows pull strength of a first insulating film and a second insulating film in a layer insulating film formed by a method explained in the conventional example, and pull strength of the first insulating film and the second insulating film in the layer insulating film formed by the method of the present invention. The pull strength by the method of the present invention is far larger, which means that adhesion of the first insulating film and the second insulating film is favorable.

In the SOD processing system 1 of this embodiment, since drying (LHP), condensation polymerization (OHP), and burning (DCC) are performed respectively after the application of the first inorganic insulating film material and after the application of the second organic insulating film material, it is unnecessary to burn the first insulating film after the formation of the second insulating film. Hence, it is not necessarily required to select a permeable material as the second insulating film, and consequently the extent of selection of a material for the second insulating film can be widened.

Furthermore, in the SOD processing system 1 of this embodiment, processing conditions of respective thermal processing steps prior to DCC are set so that both the first inorganic insulating film and the second organic insulating film can be burned at the same temperature in the same low-oxygen curing and cooling processing station (DCC), which is desirable in terms of the structure of the apparatus and energy. Namely, in the SOD processing system 1 of this embodiment, the number of the low-oxygen curing and cooling processing stations (DCC) which needs considerable energy and of which the apparatus is expensive since setting at the highest temperature is required can be decreased.

In the aforesaid embodiment, the example, in which Nanoglass manufactured by Allied Signal Inc. is used as the first inorganic insulating film material and HOSP manufactured by Allied Signal Inc. is used as the second organic insulating film material, is explained, but various other materials can be used as these insulating film materials.

For example, as the first inorganic insulating film material, XLK manufactured by Dow Corning Corporation, IPS, LDK, or ALCAP-S manufactured by Catalyst & Chemical Industries, Co., Ltd., or the like can be used.

As the second organic insulating film material, FLARE manufactured by Allied Signal Inc., Silk manufactured by The Dow Chemical Company, or the like can be used.

Processing conditions on each of these materials will be explained below.

In the case of XLK, the wafer is subjected to cooling processing at about 23° C. (CPL), coated with XLK (CT1)

subjected to aging processing (DAC), subjected to low-oxygen and high-temperature heat processing at about 200° C. (OHP), and subjected to burning processing at a temperature between 400° C. and 450° C. (DCC), whereby an insulating film is formed.

In the case of IPS, the wafer is subjected to cooling processing at about 23° C. (CPL), coated with IPS (CT1)

subjected to low-temperature heat processing at about 150° C. (LHP), subjected to low-oxygen and high-temperature heat processing at about 250° C. (OHP), further subjected to low-oxygen and high-temperature heat processing at about 350° C. (OHP), and subjected to burning processing at a temperature between 400° C. and 450° C. (DCC), whereby an insulating film is formed.

In the case of FLARE, the wafer is subjected to cooling processing at about 23° C. (CPL), coated with FLARE (CT2)

subjected to low-temperature heat processing at about 150° C. (LHP), subjected to low-oxygen and high-temperature heat processing at about 200° C. (OHP), further subjected to low-oxygen and high-temperature heat processing at about 250° C. (OHP), and subjected to burning processing at a temperature between 400° C. and 450° C. (DCC), whereby an insulating film is formed.

In the case of Silk, the wafer is subjected to cooling processing at about 23° C. (CPL), coated with Silk (CT2), subjected to low-temperature heat processing at a temperature between 150° C. and 200° C. (LHP), subjected to cooling processing at about 23° C. (CPL), coated again with Silk (CT2)

subjected to low-oxygen and high-temperature heat processing at about 320° C. (OHP), and subjected to burning processing at a temperature between 400° C. and 450° C. (DCC), whereby an insulating film is formed.

The present invention is not limited to the aforesaid embodiment and can be modified variously. For example, a substrate to be processed is not limited to a semiconductor wafer, and other substrates such as an LCD substrate and the like are also suitable.

As explained above, according to the present invention, low dielectric constant properties are satisfactory, the adhesion of the first insulating film and the second insulating film is favorable, the formation of the first insulating film and the second insulating film can be performed in the same apparatus, and in addition, the extent of selection of a material for the second insulating film can be widened.

The disclosure of Japanese Patent Application No.11-269397 filed Sep. 22, 1999 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An insulating film forming method, comprising:

(a) a step of applying an inorganic first insulating film material on a substrate;

(b) a step of applying an organic second insulating film material on the applied inorganic insulating film material;

(c) a first thermal processing step of subjecting the substrate to heat processing at different temperatures at a plurality of stages, which is performed between the step (a) and the step (b); and (d) a second thermal processing step of subjecting the substrate to heat processing at different temperatures at a plurality of stages, which is performed after the step (b), wherein in at least one of the step (c) and the step (d), the different temperatures at the plurality of stages are set to increase stepwise.

2. The method as set forth in claim 1, wherein in at least one of the step (c) and the step (d), the substrate is subjected to heat processing at a temperature not more than 500° C.

3. The method as set forth in claim 1, wherein in at least one of the step (c) and the step (d), the substrate is at least subjected to heat processing at a first temperature between 100° C. and 185° C., then subjected to heat processing at a second temperature between 100° C. and 350° C., and then subjected to heat processing at a third temperature between 400° C. and 470° C.

4. The method as set forth in claim 1, wherein at least one of the step (c) and the step (d) comprises: at least a third thermal processing step for drying a solvent in each of the applied first and second insulating film materials; and a fourth thermal processing step for performing condensation polymerization for the first and second insulating film materials in each of which the solvent is dried.

5. The method as set forth in claim 1, wherein the thermal processing step at a final stage.in the step (c) and the thermal processing step at the final stage in the step (d) are almost the same at least with respect to temperature conditions, and the processing conditions in the thermal processing step before the final stage in the step (c) and in the thermal processing step before the final stage in the step (d) are set the same.

6. The method as set forth in claim 1, wherein the first insulating film and a second insulating film are respectively applied on the substrate by a spin coating method in the step (a) and the step (b).

* * * * *